(12) United States Patent
Nam et al.

(10) Patent No.: US 9,536,916 B2
(45) Date of Patent: Jan. 3, 2017

(54) STACKED TYPE IMAGE SENSOR INCLUDING COLOR SEPARATION ELEMENT AND IMAGE PICKUP APPARATUS INCLUDING STACKED TYPE IMAGE SENSOR

(71) Applicant: SAMSUNG ELECTRONICS CO., LTD., Suwon-si (KR)

(72) Inventors: Sunghyun Nam, Yongin-si (KR); Sookyoung Roh, Seoul (KR); Seokho Yun, Hwaseong-si (KR); Hongkyu Park, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 14/920,211

(22) Filed: Oct. 22, 2015

(65) Prior Publication Data

US 2016/0118430 A1     Apr. 28, 2016

(30) Foreign Application Priority Data

Oct. 22, 2014  (KR) .................. 10-2014-0143605

(51) Int. Cl.
*H01L 27/146* (2006.01)

(52) U.S. Cl.
CPC ... *H01L 27/14625* (2013.01); *H01L 27/14605* (2013.01); *H01L 27/14621* (2013.01); *H01L 27/14627* (2013.01); *H01L 27/14645* (2013.01); *H01L 27/14667* (2013.01)

(58) Field of Classification Search
CPC .... H01L 27/14603–27/14607; H01L 27/14625
See application file for complete search history.

(56) References Cited

U.S. PATENT DOCUMENTS

| 8,258,560 | B1 * | 9/2012 | Hynecek | ............. | H01L 27/1461 |
|  |  |  |  |  | 257/292 |
| 2009/0096900 | A1 | 4/2009 | Pang et al. |  |  |
| 2009/0115011 | A1 | 5/2009 | Ushiro et al. |  |  |
| 2015/0364521 | A1 * | 12/2015 | Nam | ............. | G02B 5/201 |
|  |  |  |  |  | 257/432 |

FOREIGN PATENT DOCUMENTS

| JP | 2005-260067 A | 9/2005 |
| JP | 2007-109801 A | 4/2007 |

* cited by examiner

*Primary Examiner* — Daniel Shook
(74) *Attorney, Agent, or Firm* — Sughrue Mion, PLLC

(57) ABSTRACT

A stacked type image sensor including color separation elements, and an image pickup apparatus including the stacked type image sensor, are provided. The stacked type image sensor includes a first light sensing layer including first pixels configured to absorb and detect light of a first wavelength band and transmit light of a second wavelength band and a third wavelength band, and a second light sensing layer disposed to face the first light sensing layer, the second light sensing layer including second pixels configured to detect light of the second wavelength band and third pixels configured to detect light of the third wavelength band. The color separation elements are disposed between the first light sensing layer and the second light sensing layer, and are configured to direct the light of the second wavelength band toward the second pixels, and direct the light of the third wavelength band toward the third pixels.

16 Claims, 13 Drawing Sheets

STACKED TYPE IMAGE SENSOR INCLUDING COLOR SEPARATION ELEMENT AND IMAGE PICKUP APPARATUS INCLUDING STACKED TYPE IMAGE SENSOR

CROSS-REFERENCE TO RELATED APPLICATION

This application claims priority from Korean Patent Application No. 10-2014-0143605, filed on Oct. 22, 2014, in the Korean Intellectual Property Office, the disclosure of which is hereby incorporated by reference in its entirety.

BACKGROUND

1. Field

Apparatuses and methods consistent with exemplary embodiments relate to a stacked type image sensor including a color separation element and an image pickup apparatus including the stacked type image sensor.

2. Description of the Related Art

Color displays and color image sensors may display multicolor images and detect colors of light incident thereon by using color filters. Color displays and color image sensors may use an RGB color filter scheme in which, for example, green filters are disposed in two of four pixels and blue and red filters are disposed in the other two pixels. Alternatively, a CYGM color filter scheme, in which filters of complementary colors, i.e., cyan, yellow, green, and magenta, are respectively disposed in four pixels, may be used.

However, since the color filters absorb all colors of light except for a filtered color, the light use efficiency of the color filters may be low. For example, since RGB color filters may transmit only about $1/3$ of incident light and absorb about $2/3$ of the incident light, the light use efficiency of the RGB color filters may only be about 33%. Therefore, most of the optical loss of the color filters of the color displays or the color image sensors may be caused by the color filters.

Attempts have been made to use color separation elements rather than the color filters to increase light use efficiency of the color displays and the color image sensors. The color separation elements may separate colors of incident light based on diffraction or refraction characteristics of light varying according to wavelengths of light, and may transmit the separated colors to pixels of corresponding colors. Therefore, the light use efficiency may be higher when using the color separation elements than the color filters. However, since color separation efficiency of color separation elements may change according to incident angles of light, color separation efficiency of a plurality of pixels of an image sensor may vary, and thus, the plurality of pixels may have different sensitivities.

SUMMARY

According to an aspect of an exemplary embodiment, there is provided an image sensor including a first light sensing layer including first pixels configured to absorb and detect light of a first wavelength band and transmit light of a second wavelength band and a third wavelength band, and a second light sensing layer disposed to face the first light sensing layer, the second light sensing layer including second pixels configured to detect light of the second wavelength band and third pixels configured to detect light of the third wavelength band. The image sensor further includes color separation elements disposed between the first light sensing layer and the second light sensing layer, the color separation elements being configured to direct the light of the second wavelength band toward the second pixels, and direct the light of the third wavelength band toward the third pixels, and each of the color separation elements being symmetric in at least four directions parallel to a surface of the second light sensing layer.

The first pixels may be arranged in a two-dimensional (2D) array structure, and the second pixels and the third pixels may be alternately arranged in a 2D array structure.

The first pixels, the second pixels and the third pixels may be a same size, and boundaries of the first pixels may be aligned with boundaries of the second pixels and the third pixels.

Each of the first pixels may overlap a portion of one of the second pixels and a portion of one of the third pixels.

The second light sensing layer may include first pixel rows in which the second pixels and the third pixels are alternately arranged in an order of a second pixel and a third pixel in a first direction, and second pixel rows in which the third pixels and the second pixels are alternately arranged in an order of a third pixel and a second pixel in the first direction. The first pixel rows and the second pixel rows may be alternately arranged in a second direction perpendicular to the first direction.

The color separation elements may be disposed to face the respective second pixels, and the color separation elements may be configured to direct the light of the second wavelength band in a straight downward direction, and direct the light of the third wavelength band toward sides of the color separation elements.

Each of the color separation elements may be symmetric in a horizontal direction of the second light sensing layer, a vertical direction of the second light sensing layer, a first diagonal direction, and a second diagonal direction that intersects the first diagonal direction.

Each of the color separation elements may include a first arm that extends in a first diagonal direction and a second arm that extends in a second diagonal direction that intersects the first diagonal direction.

The color separation elements may be disposed to face the respective third pixels, and the color separation elements may be configured to direct the light of the third wavelength band in a straight downward direction, and direct the light of the second wavelength band toward sides of the color separation elements.

Each of the color separation elements may be shaped as at least one of a square tube, a cylinder, a cylindrical tube, a hexagonal pillar, and a hexagonal tube.

The color separation elements may be disposed to face respective interfaces between the second pixels and the third pixels, and the color separation elements may be configured to direct the light of the second wavelength band toward first sides of the color separation elements, and direct the light of the third wavelength band toward second sides of the color separation elements, the second sides being opposite to the first sides.

The image sensor may further include a color filter layer including a first color filter that is disposed on the second pixels and is configured to transmit the light of the second wavelength band to the second pixels, and a second color filter that is disposed on the third pixels and is configured to transmit the light of the third wavelength band to the third pixels.

The image sensor may further include a transparent dielectric layer disposed between the first and second light sensing layers, the transparent dielectric layer covering the color separation elements.

The color separation elements may include a material having a refractive index greater than that of the transparent dielectric layer.

According to an aspect of another exemplary embodiment, there is provided an image pickup apparatus including an image sensor, the image sensor including a first light sensing layer including first pixels configured to absorb and detect light of a first wavelength band and transmit light of a second wavelength band and a third wavelength band, and a second light sensing layer disposed to face the first light sensing layer, the second light sensing layer including second pixels configured to detect light of the second wavelength band and third pixels configured to detect light of the third wavelength band. The image sensor further includes color separation elements disposed between the first light sensing layer and the second light sensing layer, the color separation elements being configured to direct the light of the second wavelength band toward the second pixels, and direct the light of the third wavelength band toward the third pixels.

Each of the color separation elements may be symmetric in at least four directions parallel to a surface of the second light sensing layer.

BRIEF DESCRIPTION OF THE DRAWINGS

These and/or other aspects will become apparent and more readily appreciated from the following description of exemplary embodiments, taken in conjunction with the accompanying drawings in which.

DETAILED DESCRIPTION

Figure 1:
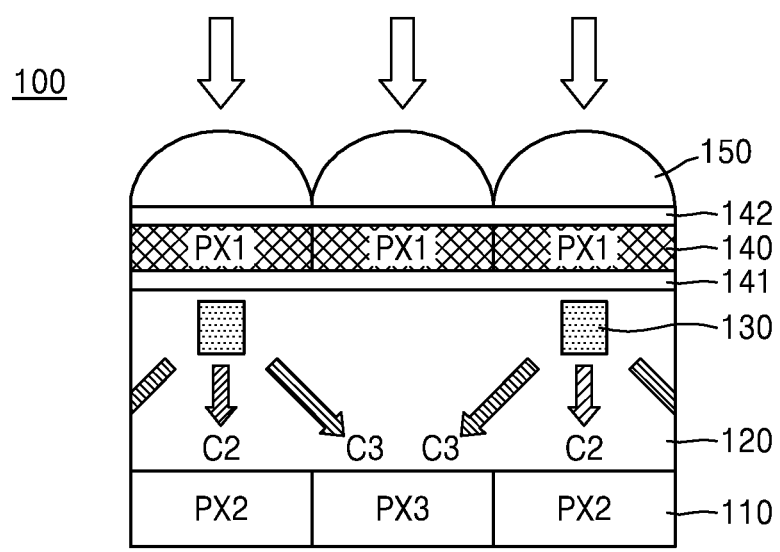
FIG. 1 is a schematic cross-sectional view of a structure of an image sensor according to an exemplary embodiment.

Hereinafter, a stacked type image sensor including color separation elements and an image pickup apparatus including the image sensor will be described in detail with reference to the accompanying drawings. In the drawings, like reference numbers refer to like elements, and also the size of each element may be exaggerated for clarity of illustration. Exemplary embodiments described herein are for illustrative purposes only, and various modifications may be made therefrom. In the following description, when an element is referred to as being "above" or "on" another element in a layered structure, it may be directly on the other element while making contact with the other element or may be above the other element without making contact with the other element. Expressions such as "at least one of," when preceding a list of elements, modify the entire list of elements and do not modify the individual elements of the list.

FIG. 1 is a schematic cross-sectional view of a structure of an image sensor according to an exemplary embodiment. Referring to FIG. 1, the image sensor 100 includes a first light sensing layer 140 including a plurality of first pixels Px1 absorbing and detecting light of a first wavelength band and transmitting light of other wavelength bands. The image sensor 100 further includes a second light sensing layer 110 including a plurality of second pixels Px2 detecting light of a second wavelength band and a plurality of third pixels Px3 detecting light of a third wavelength band. The image sensor 100 further includes color separation elements 130 disposed between the first light sensing layer 140 and the second light sensing layer 110. The color separation elements 130 direct light of the second wavelength band passed through the first light sensing layer 140 toward the second pixels Px2 of the second light sensing layer 110, and direct light of the third wavelength band passed through the first light sensing layer 140 toward the third pixels Px3 of the second light sensing layer 110.

In addition, the image sensor 100 further includes a transparent dielectric layer 120 disposed between the first light sensing layer 140 and the second light sensing layer 110. The image sensor 100 further includes a first transparent electrode 141 and a second transparent electrode 142 respectively disposed on a lower surface and an upper surface of the first light sensing layer 140. The image sensor 100 further includes a plurality of microlenses 150 disposed on top of the second transparent electrode 142. The color separation elements 130 are covered by and fixed in the transparent dielectric layer 120. The first transparent electrode 141 and the second transparent electrode 142 apply driving voltages to the first light sensing layer 140, and may be formed of, for example, a transparent conductive oxide such as indium tin oxide (ITO), indium zinc oxide (IZO), aluminum zinc oxide (AZO), or gallium zinc oxide (GZO).

The first light sensing layer 140 and the second light sensing layer 110 are stacked as shown in FIG. 1. In detail, the transparent dielectric layer 120 is disposed on an upper surface of the second light sensing layer 110, and the first light sensing layer 140 is disposed on an upper surface of the transparent dielectric layer 120 opposite the second light sensing layer 110. In this case, the first light sensing layer 140 and the second light sensing layer 110 are configured to detect light of different wavelength bands. In detail, the first light sensing layer 140 absorbs only light of a first wavelength band, and transmits light of second and third wavelength bands. For example, the first light sensing layer 140 may absorb only light of a green wavelength band, and may transmit light of red and blue wavelength bands.

Figure 2A:
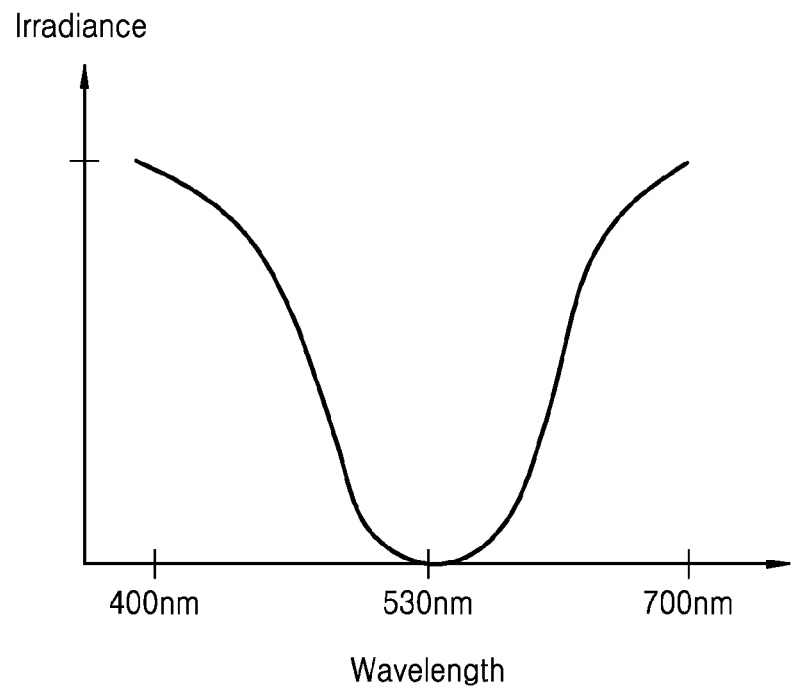
FIG. 2A is a graph of a transmission spectrum of a first light sensing layer of the image sensor of FIG. 1.

FIG. 2A is a graph of a transmission spectrum of the first light sensing layer 140 of the image sensor 100 of FIG. 1. Referring to the graph in FIG. 2A, the first light sensing layer 140 transmits most blue light in a 400-nm wavelength band and most red light in a 700-nm wavelength band, but absorbs most green light in a 530-nm wavelength band. The first light sensing layer 140 having the above-described characteristics may include a material such as, for example, rhodamine-based pigment, a merocyanine-based pigment, or quinacridone.

According to the exemplary embodiment, however, the absorbed wavelength band of the first light sensing layer 140 is not limited to a green wavelength band. Alternatively, the first light sensing layer 140 may only absorb and detect light of a red wavelength band, and may transmit light of blue and green wavelength bands. Alternatively, the first light sensing layer 140 may only absorb light of a blue wavelength band, and may transmit light of green and red wavelength bands. For example, the first light sensing layer 140 may include a phthalocyanine-based pigment to detect light of a green wavelength band, or may include a material such as a coumarin-based pigment, tris-(8-hydroxyquinoline) aluminum ($Alq_3$), or a merocyanine-based pigment to detect light of a blue wavelength band. For convenience of description, the following description will be presented under the assumption that the first light sensing layer 140 only absorbs and detects light of a green wavelength band, and transmits light of red and blue wavelength bands.

As described above, since light of a first wavelength band incident on the image sensor 100 is absorbed by the first light sensing layer 140, only light of second and third wavelength bands is transmitted through the first light sensing layer 140. After passing through the first light sensing layer 140, the light of the second and third wavelength bands are incident on the transparent dielectric layer 120, and then are separated by the color separation elements 130. The color separation elements 130 are disposed at a light entrance side of the second light sensing layer 110 to separate the incident light according to the wavelengths thereof so that the different wavelengths of the incident light enter different pixels. The color separation elements 130 separate colors of the incident light thereon by changing a propagation direction of the incident light according to the wavelengths of the incident light based on diffraction or refraction characteristics of the light varying according to the wavelengths of the light. Accordingly, the color separation elements 130 may be formed of a material having a refractive index greater than that of the transparent dielectric layer 120 that surrounds the color separation elements 130. For example, the transparent dielectric layer 120 may be formed of $SiO_2$ or siloxane-based spin-on-glass (SOG), and the color separation elements 130 may be formed of a material having a high refractive index such as $TiO_2$, $SiN_3$, ZnS, ZnSe, or $Si_3N_4$. Various structures are known in the related art as structures for color separation elements. Thus, the structure of the color separation elements 130 may be variously designed according to desired spectrum distributions of exiting light.

Referring again to FIG. 1, the color separation elements 130 divide incident light thereon into light C2 of a second wavelength band and light C3 of a third wavelength band. In this example, the color separation elements 130 does not change a propagation direction of the light C2 of the second wavelength band, and changes a propagation direction of the light C3 of the third wavelength band toward lateral sides thereof. Then, the light C2 of the second wavelength band is incident on the second pixels Px2 located under the color separation elements 130, and the light C3 of the third wavelength band is incident on the third pixels Px3 located at the lateral sides of the color separation elements 130. Therefore, the second pixels Px2 located under the color separation elements 130 detect the light C2 of the second wavelength band, and the third pixels Px3 located at the lateral sides of the color separation elements 130 detect the light C3 of the third wavelength band. For example, the light C2 of the second wavelength band may be blue light, and the light C3 of the third wavelength band may be red light.

Figure 2B:
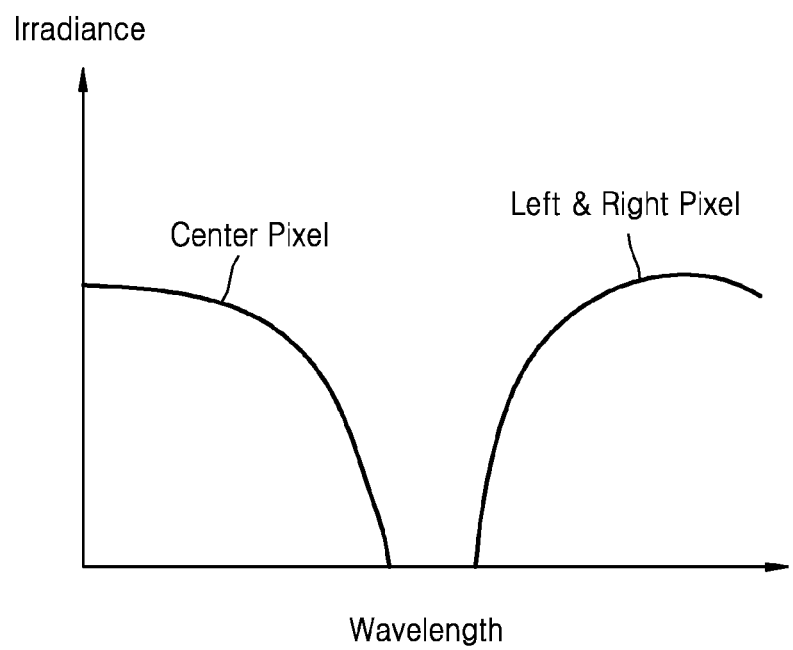
FIG. 2B is a graph of a color separation spectrum of color separation elements of the image sensor of FIG. 1.

FIG. 2B is a graph of a color separation spectrum of the color separation elements 130 of the image sensor 100 of FIG. 1. As shown in FIG. 2B, the color separation elements 130 separate light of a blue wavelength band and light of a red wavelength band by directing the light of the blue wavelength band in a straight downward direction toward a center pixel of the second light sensing layer 110 and directing the light of the red wavelength band toward left and right sides thereof toward left and right pixels of the center pixel. In this way, the first light sensing layer 140 absorbs and detects green light, and the second light sensing layer 110 detects the blue and red light transmitted through the first light sensing layer 140.

Referring again to FIG. 1, according to the exemplary embodiment, the first pixels Px1 of the first light sensing layer 140 and the second and third pixels Px2 and Px3 may have the same size.

Figure 3:
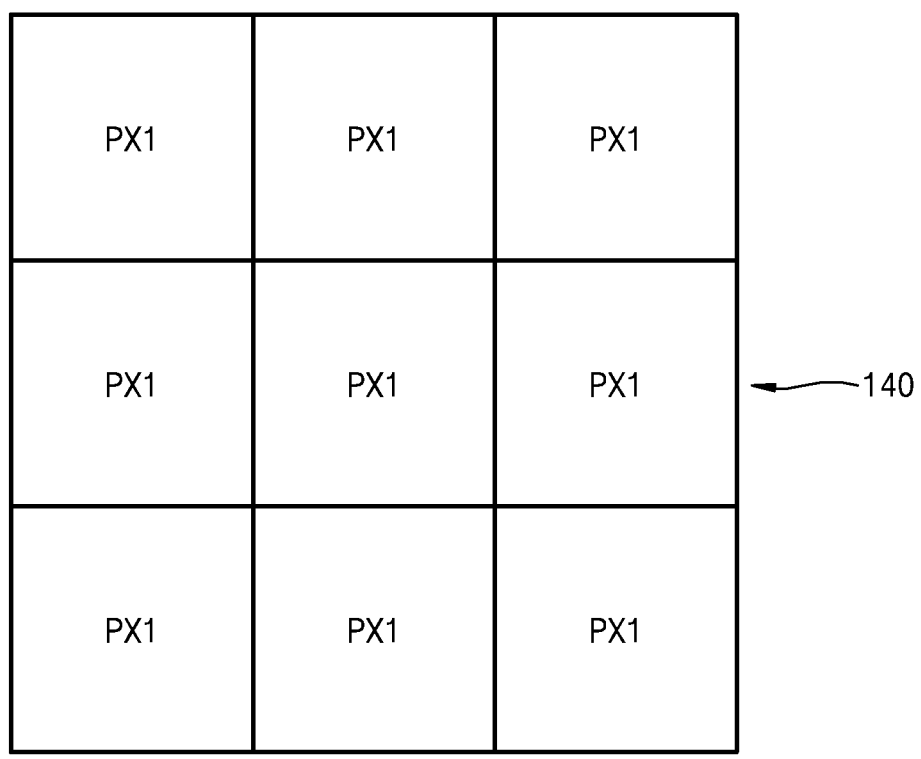
FIG. 3 is a schematic plan view of a pixel structure of the first light sensing layer of the image sensor of FIG. 1.
Figure 4:
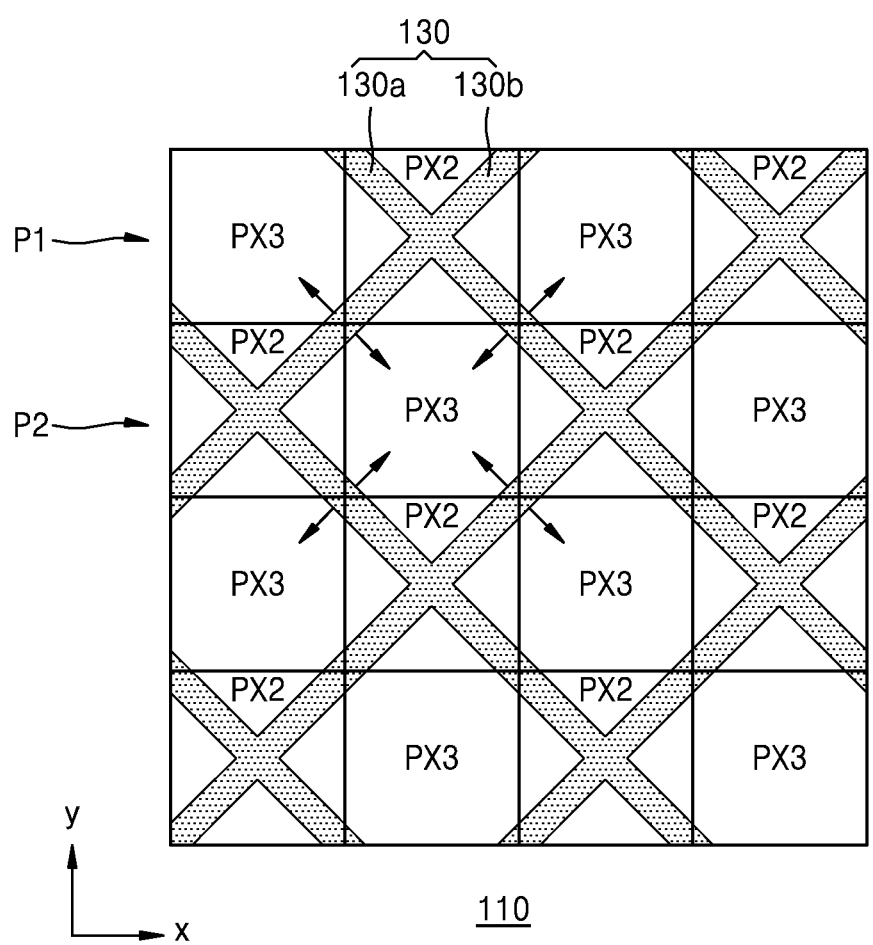
FIG. 4 is a schematic plan view of a pixel structure of a second light sensing layer of the image sensor of FIG. 1.

FIG. 3 is a schematic plan view of a pixel structure of the first light sensing layer 140 of the image sensor 100 of FIG. 1, and FIG. 4 is a schematic plan view of a pixel structure of the second light sensing layer 110 of the image sensor of 100 FIG. 1. Referring to FIGS. 3 and 4, the first pixels Px1 of the first light sensing layer 140 are arranged in a two-dimensional (2D) array structure, and the second and third pixels Px2 and Px3 of the second light sensing layer 110 are arranged in a 2D array structure. The first pixels Px1 of the first light sensing layer 140 may match the second and third pixels Px2 and Px3 of the second light sensing layer 110 in such a manner that boundaries of the first pixels Px1 are aligned with those of the second and third pixels Px2 and Px3.

Referring to FIG. 4, the second and third pixels Px2 and Px3 of the second light sensing layer 110 are alternately arranged in rows and columns. For example, the second light sensing layer 110 includes first pixel rows P1 in which the plurality of second pixels Px2 and the plurality of third pixels Px3 are alternately arranged in an order of the second pixels Px2 before the third pixels Px3 in a left-to-right horizontal direction, and second pixel rows P2 in which the plurality of third pixels Px3 and the plurality of second pixels Px2 are alternately arranged in an order of the third pixels Px3 before the second pixels Px2 in the left-to-right horizontal direction. The first pixel rows P1 and the second pixel rows P2 are alternately arranged in a vertical direction. The color separation elements 130 are disposed to face the second pixels Px2. Therefore, the color separation elements 130 provide light C2 of a second wavelength band for the second pixels Px2, and light C3 of a third wavelength band for the third pixels Px3 disposed at left and right sides of the second pixels Px2.

As shown in FIG. 4, each of the color separation elements 130 includes a first arm 130a extending in a first diagonal direction, and a second arm 130b extending in a second diagonal direction that intersects the first diagonal direction. The color separation elements 130 are symmetric in at least four directions parallel to a surface of the second light sensing layer 110, when viewing from a normal direction of the second light sensing layer 110. For example, the color separation elements 130 shown in FIG. 4 are symmetric in a horizontal axis (x-axis) direction of the second light sensing layer 110, a vertical direction (y-axis) of the second light sensing layer 110, the first diagonal direction, and the second diagonal direction. Since the color separation elements 130 are symmetric in at least four directions, that is, have a structure with at least four-fold symmetry, an extent to which color separation efficiency of the color separation elements 130 changes based on the center of the image sensor 100 in an azimuth direction, may be decreased.

Figure 5:
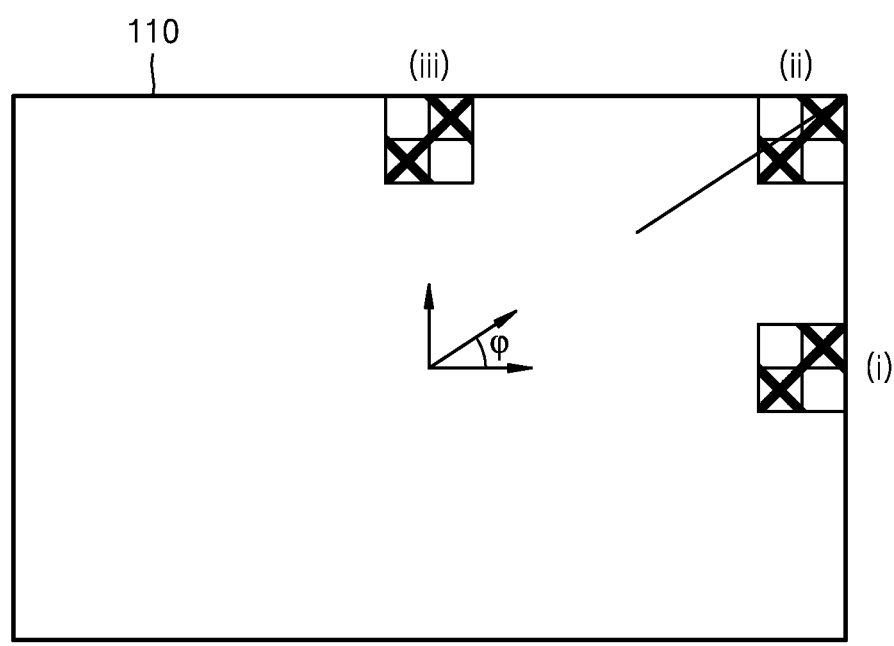
FIG. 5 is a diagram illustrating a principle related to color separation elements of FIG. 4 having substantially constant color separation efficiency with respect to directions of incident light.

FIG. 5 is a schematic diagram of the second light sensing layer 110, illustrating a principle related to the color separation elements 130 shown in FIG. 4 having substantially constant color separation efficiency with respect to directions of incident light. Referring to FIG. 5, it is assumed that an azimuth φ of a right peripheral area (i) in the second light sensing layer 110 is 0°, and an azimuth φ of an upper peripheral area (iii) in the second light sensing layer 110 is 90°. Since the color separation elements 130 have a structure with at least four-fold symmetry, characteristics of the color separation elements 130 may be almost identical in areas where an azimuth φ is 0°, 90°, 180°, and 270°. That is, the color separation efficiency of the color separation elements 130 may almost be the same in the right peripheral area (i) and the upper peripheral area (iii). However, in a diagonal peripheral area (ii) in the second sensing layer 110, the color separation efficiency of the color separation elements 130 may be different from that in the right peripheral area (i) and the upper peripheral area (iii).

If the color separation elements 130 are only symmetric with respect to any axis, the color separation efficiency of the color separation elements 130 disposed in an area where an azimuth φ is 0° may be greatly different from the color separation efficiency of the color separation elements 130 disposed in an area where an azimuth φ is 180°. Also, if the color separation elements 130 are symmetric with respect to only two axes, the color separation efficiency of the color separation elements 130 disposed in an area where an azimuth φ is 0° may be greatly different from the color separation efficiency of the color separation elements 130 disposed in an area where an azimuth φ is 90°. According to the exemplary embodiment, since the color separation elements 130 have a structure with at least four-fold symmetry, the color separation efficiency of the color separation elements 130 disposed in left and right peripheral areas of the image sensor 100 may be almost the same as the color separation efficiency of the color separation elements 130 disposed in upper and lower peripheral areas of the image sensor 100. Therefore, sensitivities of a plurality pixels of the image sensor 100 may be relatively constant.

According to the exemplary embodiment, since the first light sensing layer 140 and the second light sensing layer 110 of the image sensor 100 are arranged in a stacked manner, a number of pixels per area may be increased. Therefore, a resolution of the image sensor 100 may be improved. Also, the first light sensing layer 140 may absorb and detect most of light of a first wavelength band. In addition, light of second and third wavelength bands separated by the color separation elements 130 may be detected by the second light sensing layer 110 almost without any loss. Therefore, light may be efficiently used. Thus, a sensitivity of the image sensor 100 may be improved. Furthermore, the color separation elements 130 may be configured to separate only light of two wavelength bands, and thus, the color separation elements 130 may be easily designed and manufactured. The image sensor 100 may be applied to various image pickup apparatuses for providing high-quality images.

Figure 6:
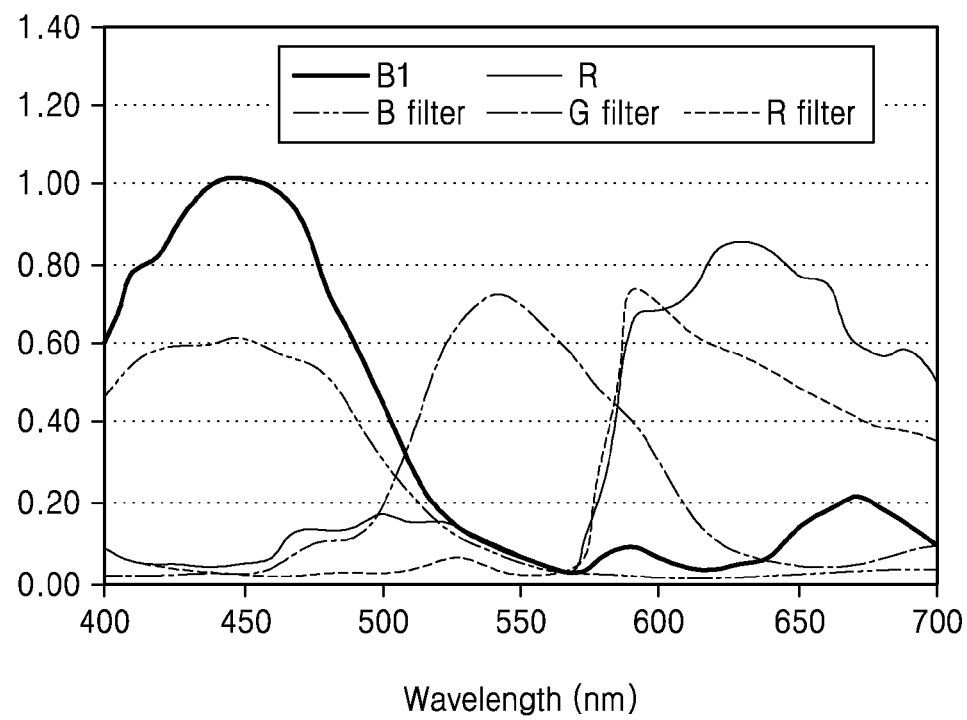
FIG. 6 is a graph of color separation efficiency of the pixel structure of the second light sensing layer of FIG. 4.

FIG. 6 is a graph of color separation efficiency of the pixel structure of the second light sensing layer 110 of FIG. 4. In the graph of FIG. 6, 'R filter' refers to transmission characteristics of a red filter, 'G filter' refers to transmission characteristics of a green filter, and 'B filter' refers to transmission characteristics of a blue filter. Also, in the graph of FIG. 6, 'R' refers to an absorption spectrum in the second pixels Px2, and 'B1' refers to an absorption spectrum in the third pixels Px3. As shown in FIG. 6, a larger amount of light may be absorbed when the second pixels Px2 and the third pixels Px3 are used than when color filters are used.

The above-described structures of the first light sensing layer 140 and the second light sensing layer 110 of the image sensor 100 and the above-described characteristics of the color separation elements 130 are exemplary embodiments of structures and characteristics. That is, image sensors having various structures other than those described above may be provided. For example, various color separation characteristics may be obtained according to a design of the color separation elements 130, and the structure of the second light sensing layer 110 may be variously modified according to the design of the color separation elements 130. Furthermore, a relative arrangement of the first light sensing layer 140 and the second light sensing layer 110 may be variously modified.

Figure 7:
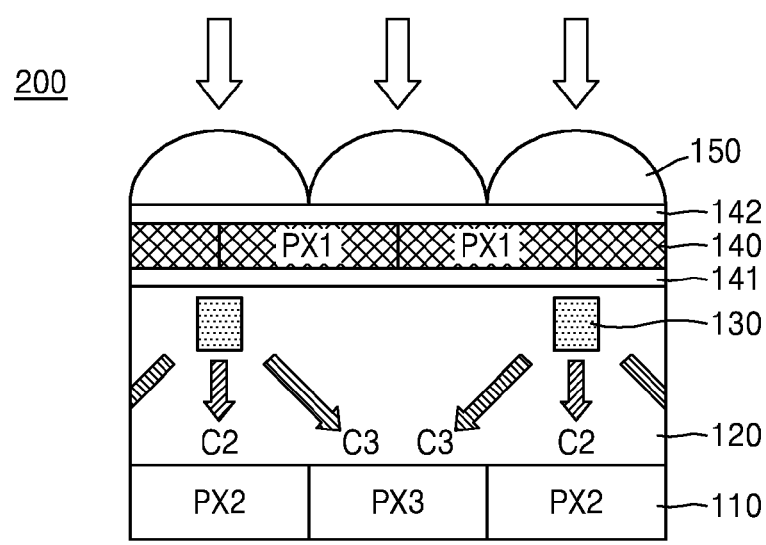
FIG. 7 is a schematic cross-sectional view of a structure of an image sensor according to another exemplary embodiment.

FIG. 7 is a schematic cross-sectional view of a structure of an image sensor 200 according to another exemplary embodiment. In comparison to the image sensor 100 shown in FIG. 1, the first light sensing layer 140 and the second light sensing layer 110 of the image sensor 200 shown in FIG. 7 are shifted relative to each other. For example, the first light sensing layer 140 may be shifted relative to the second light sensing layer 110 by ½ of a pixel width. Therefore, first pixels Px1 of the first light sensing layer 140 may range over halves of second and third pixels Px2 and Px3 of the second light sensing layer 110. Therefore, each of the first pixels Px1 of the first light sensing layer 140 may overlap a portion of one of the second pixels Px2 and a portion of one of the third pixels Px3. Thus, a resolution of the image sensor 200 may be improved by analyzing color information of the overlapping portions.

Figure 8:
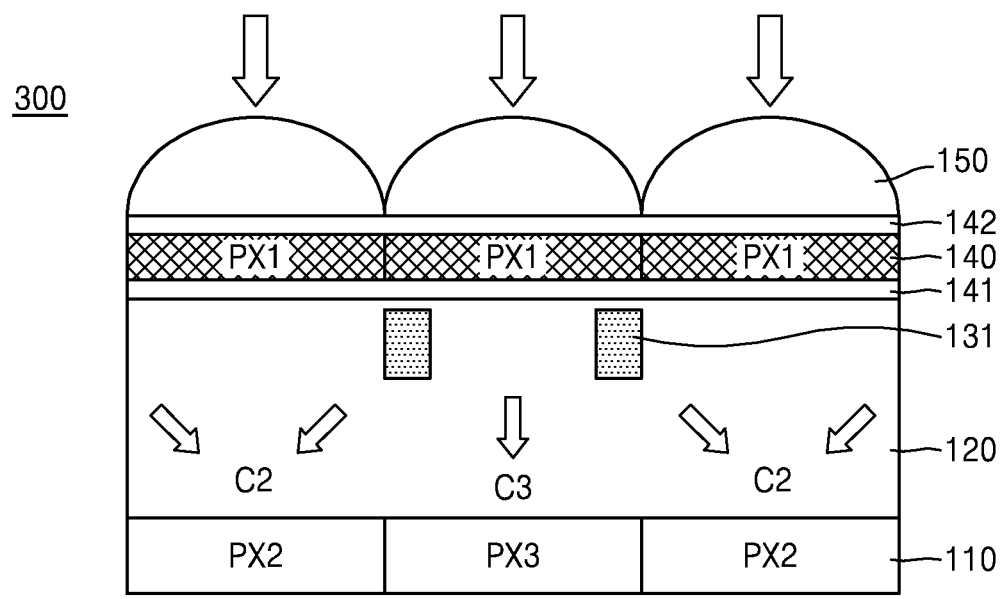
FIG. 8 is a schematic cross-sectional view of a structure of an image sensor according to another exemplary embodiment.

FIG. 8 is a schematic cross-sectional view of a structure of an image sensor 300 according to another exemplary embodiment. Referring to FIG. 8, the image sensor 300 includes the first light sensing layer 140 including a plurality of first pixels Px1 absorbing and detecting light of a first wavelength band and transmitting light of other wavelength bands. The image sensor 300 further includes the second light sensing layer 110 including a plurality of second pixels Px2 detecting light of a second wavelength band, and a plurality of third pixels Px3 detecting light of a third wavelength band. The image sensor 300 further includes color separation elements 131 disposed between the first light sensing layer 140 and the second light sensing layer 110.

The color separation elements 131 direct light of the second wavelength band passed through the first light sensing layer 140 toward the second pixels Px2 of the second light sensing layer 110, and light of the third wavelength band passed through the first light sensing layer 140 toward the third pixels Px3 of the second light sensing layer 110. In comparison to the exemplary embodiment shown in FIG. 1, the color separation elements 131 face the third pixels Px3 instead of the second pixels Px2. Therefore, the color separation elements 131 changes a propagation direction of light C2 of the second wavelength band to be inclined toward lateral sides without changing a propagation direction of light C3 of the third wavelength band. Accordingly, the light C3 of the third wavelength band is incident on the third pixels Px3 that are directly below the color separation elements 131, and the light C2 of the second wavelength band is incident on the second pixels Px2 at the lateral sides of the color separation elements 131.

Figure 9:
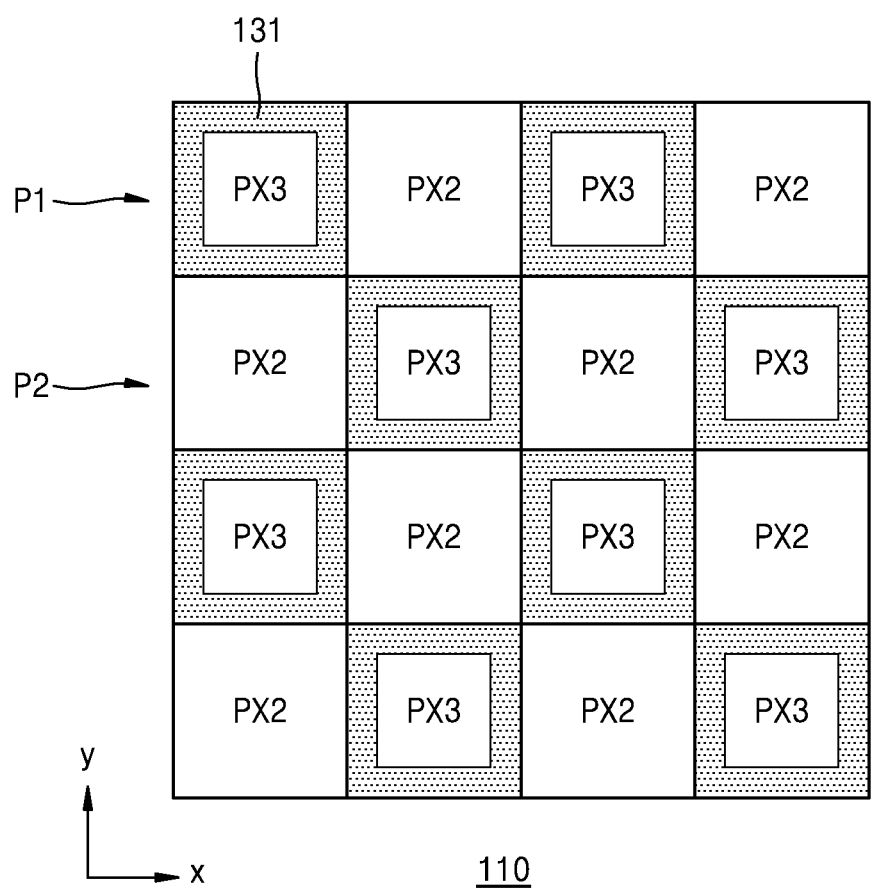
FIG. 9 is a schematic plan view of a pixel structure of a second light sensing layer of the image sensor of FIG. 8.

FIG. 9 is a schematic plan view of a pixel structure of the second light sensing layer 110 of the image sensor 300 of FIG. 8. Referring to FIG. 9, the second and third pixels Px2 and Px3 of the second light sensing layer 110 are alternately arranged in rows and columns. For example, the second light sensing layer 110 includes first pixel rows P1 in which the plurality of second and third pixels Px2 and Px3 are alternately arranged in an order of a third pixel Px3 before a second pixel Px2 in a left-to-right horizontal direction, and second pixel rows P2 in which the plurality of second and third pixels Px2 and Px3 are alternately arranged in an order of a second pixel Px2 before a third pixel Px3 in the left-to-right horizontal direction. The first pixel rows P1 and the second pixel rows P2 are alternately arranged in a vertical direction. The color separation elements 131 are disposed to face the third pixels Px3.

As shown in FIG. 9, each of the color separation elements 131 are shaped as, for example, a square tube. Therefore, the color separation elements 131 are symmetric in at least four directions parallel to a surface of the second light sensing layer 110, when viewing from a normal direction of the second light sensing layer 110. For example, the color separation elements 131 are symmetric in a horizontal axis (x-axis) direction of the second light sensing layer 110, a vertical direction (y-axis) of the second light sensing layer 110, a first diagonal direction, and a second diagonal direction. As described above, since the color separation elements 131 are symmetric in at least four directions, that is, have a structure with at least four-fold symmetry, an extent to which color separation efficiency of the color separation elements 131 changes based on the center of the image sensor 100 in an azimuth direction, may be decreased.

Figure 10:
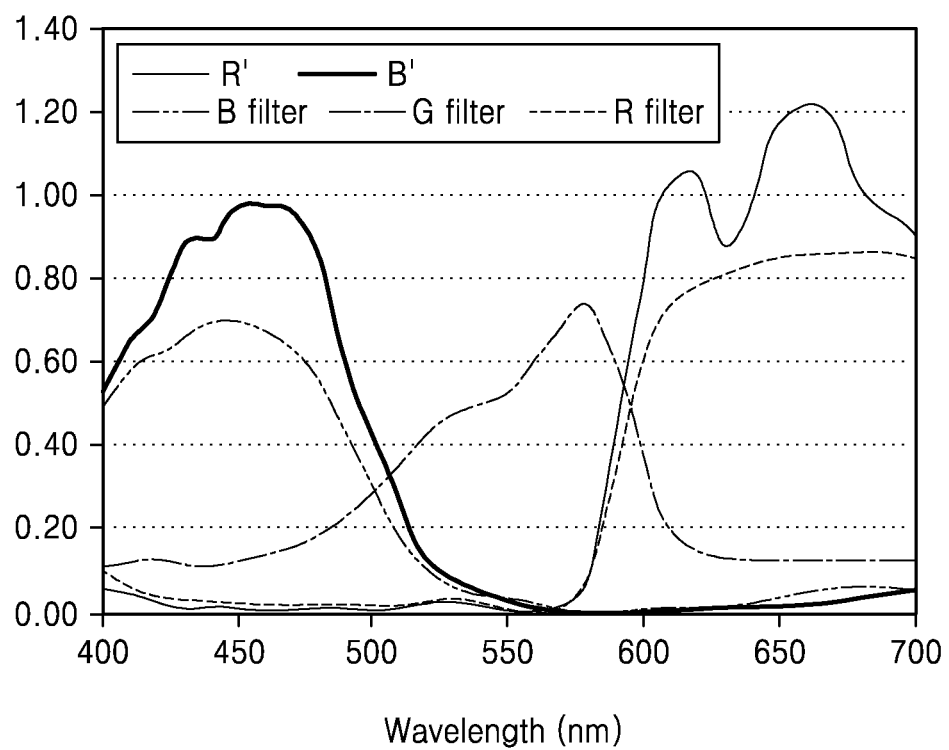
FIG. 10 is a graph of color separation efficiency of the pixel structure of the second light sensing layer of FIG. 9.

FIG. 10 is a graph of color separation efficiency of the pixel structure of the second light sensing layer 110 of FIG. 9. In the graph of FIG. 10, 'R filter' refers to transmission characteristics of a red filter, 'G filter' refers to transmission characteristics of a green filter, and 'B filter' refers to transmission characteristics of a blue filter. Also, in the graph of FIG. 10, 'R' refers to an absorption spectrum in the second pixels Px2, and 'B'' refers to an absorption spectrum in the third pixels Px3. As shown in FIG. 10, a larger amount of light may be absorbed when the second pixels Px2 and the third pixels Px3 are used than when color filters are used.

The color separation elements 130 of FIG. 4, which are color separation elements having a structure with four-fold symmetry, are illustrated as including the first and second arms 130a and 130b that perpendicularly cross each other in two diagonal directions. Also, each of the color separation elements 131 of FIG. 9 is illustrated as being shaped as a square tube. However, other than the structures of the color separation elements 130 and 131 of FIGS. 4 and 9, respectively, color separation elements may have various structures with more than four-fold symmetry according to desired color separation characteristics. For example, color separation elements having a shape of a cylinder, a cylindrical tube, a hexagonal pillar, a hexagonal tube, or other various forms may be selected and used according to properties of image sensors.

Figure 11:
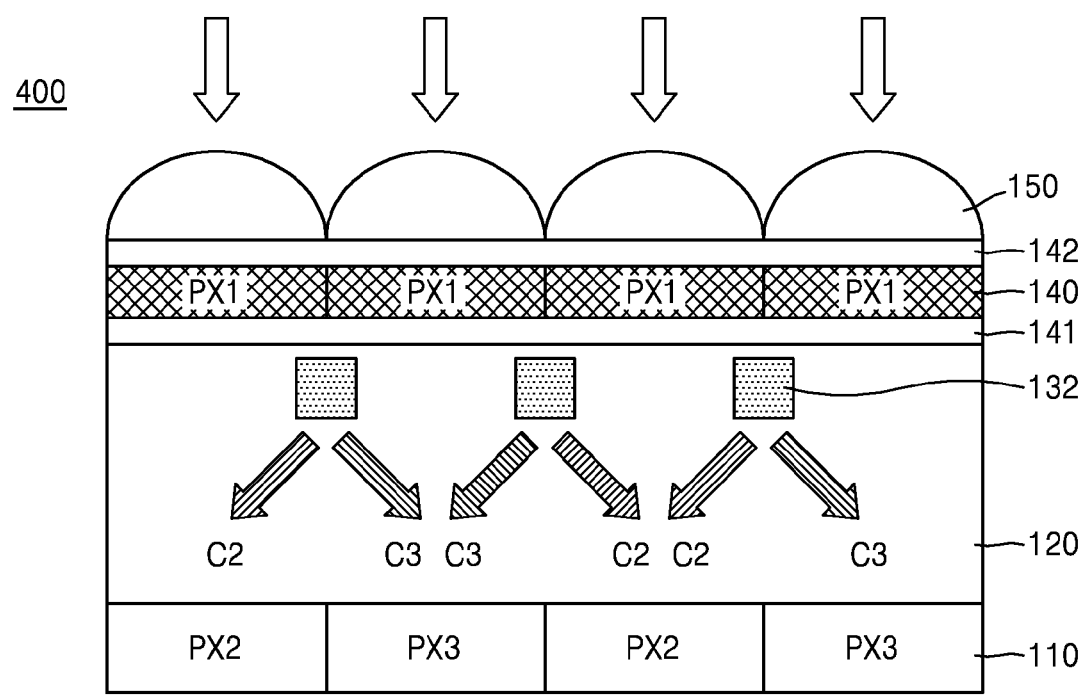
FIG. 11 is a schematic cross-sectional view of a structure of an image sensor according to another exemplary embodiment.

FIG. 11 is a schematic cross-sectional view of a structure of an image sensor 400 according to another exemplary embodiment. The image sensor 400 shown in FIG. 11 includes color separation elements 132 configured to direct light C2 of a second wavelength band toward left sides and light C3 of a third wavelength band toward right sides. In this case, the color separation elements 132 are arranged to face interfaces between second and third pixels Px2 and Px3. Therefore, the light C2 of the second wavelength band separated by the color separation elements 132 are incident on the second pixels Px2 disposed at the left sides of the color separation elements 132, and the light C3 of the third wavelength band separated by the color separation elements 132 are incident on the third pixels Px3 disposed at the right sides of the color separation elements 132. The color separation elements 132 of FIG. 11 may also be configured to have a structure with at least four-fold symmetry. Other elements of the image sensor 400 of FIG. 11 may be the same as those of the image sensor 100 of FIG. 1.

Other color separation elements having various color separation characteristics may be used, and pixel arrangements of the first light sensing layer 140 and the second light sensing layer 110 may vary according to the color separation characteristics of the color separation elements.

A distance between the color separation elements 130, 131, or 132 and the second light sensing layer 110 may be several micrometers or shorter, for example, 1 micrometer or shorter. Since the distance between the color separation elements 130, 131, or 132 and the second light sensing layer 110 is short, colors may not be fully separated in some cases. Thus, color filters may additionally be used to reduce a possibility of color mixing and improve color reproducibility.

Figure 12:
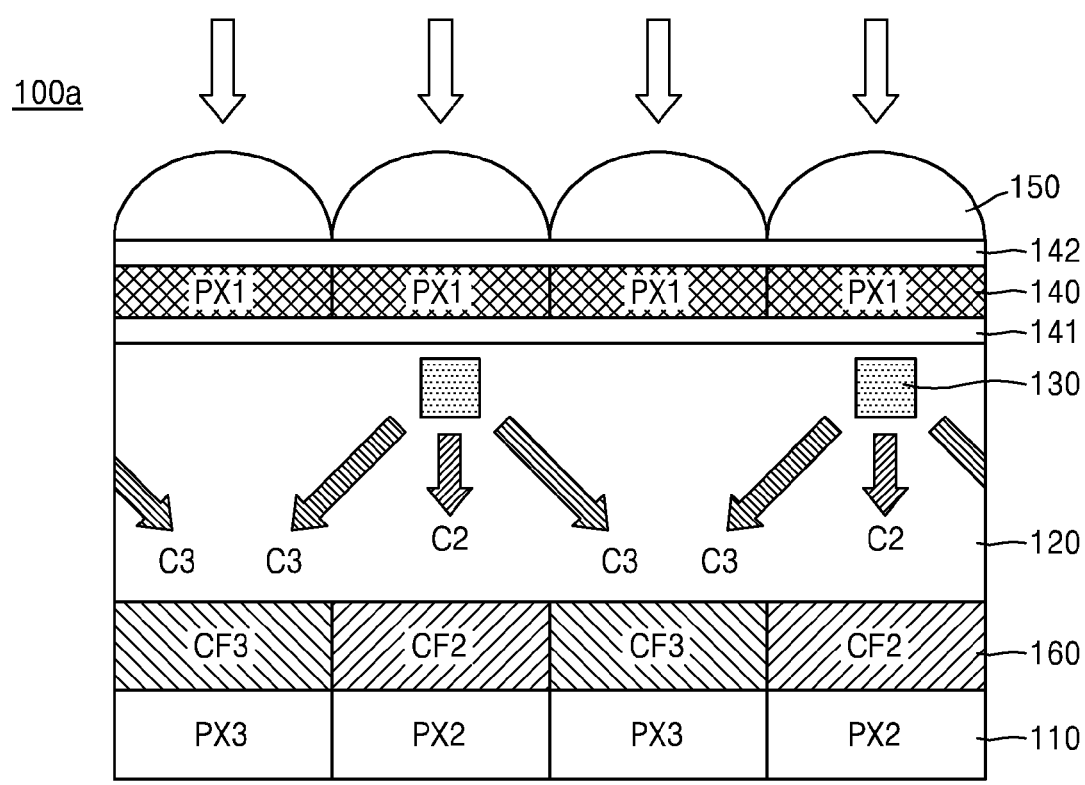
FIG. 12 is a schematic cross-sectional view of a structure of an image sensor according to another exemplary embodiment.
Figure 13:
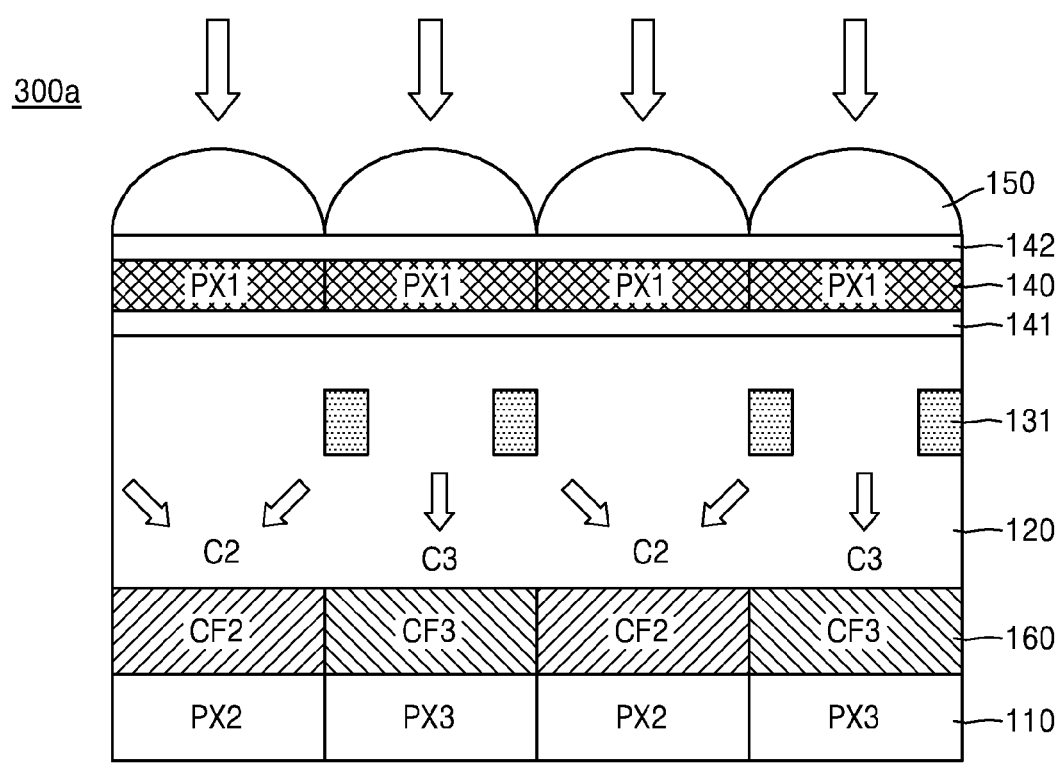
FIG. 13 is a schematic cross-sectional view of a structure of an image sensor according to another exemplary embodiment.
Figure 14:
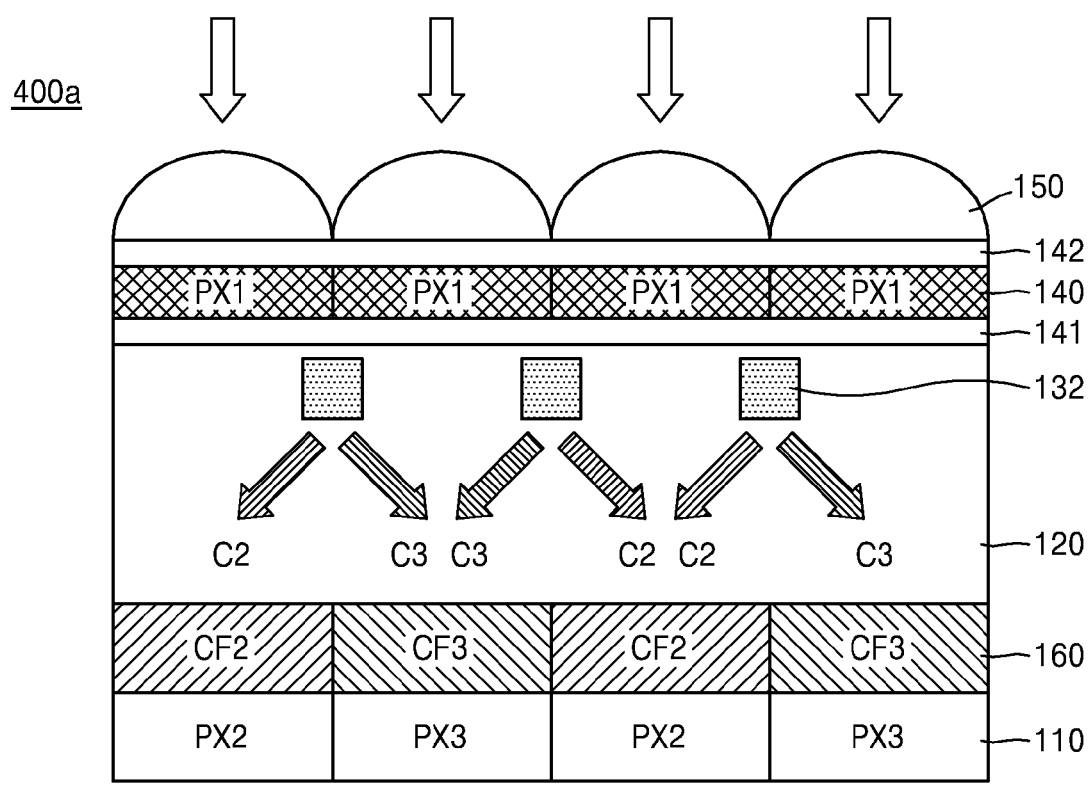
FIG. 14 is a schematic cross-sectional view of a structure of an image sensor according to another exemplary embodiment.

FIGS. 12 to 14 are schematic cross-sectional views of structures of image sensors 100a, 300a, and 400a, respectively, according to other exemplary embodiments. Referring to FIG. 12, the image sensor 100a further includes a color filter layer 160 as compared with the image sensor 100 illustrated in FIG. 1. Referring to FIG. 13, the image sensor 300a further includes a color filter layer 160 as compared with the image sensor 300 illustrated in FIG. 8. Referring to FIG. 14, the image sensor 400a further includes a color filter layer 160 as compared with the image sensor 400 illustrated in FIG. 11. In each case, the color filter layer 160 is disposed on top of the second light sensing layer 110. For example, the color filter layer 160 includes second color filters CF2 disposed on top of second pixels Px2 and transmitting only light C2 of a second wavelength band, and third color filters CF3 disposed on top of third pixels Px3 and transmitting only light C3 of a third wavelength band. Although the color filter layer 160 is used, since the light C2 and the light C3 significantly separated by color separation elements 130, 131, or 132 are incident on the color filters CF2 and CF3, respectively, an optical loss caused by the color filter layer 160 may not be large. Therefore, the image sensors 100a, 300a, and 400a illustrated in FIGS. 12 to 14 may have high light use efficiency and excellent color reproducibility.

As described above, according to the above exemplary embodiments, a stacked type image sensor including color separation elements and an image pickup apparatus including the image sensor have been described with reference to the accompanying drawings. However, it should be understood that the exemplary embodiments described herein are to be considered in a descriptive sense only and not for purposes of limitation. Descriptions of features or aspects within each exemplary embodiment should be considered as available for other similar features or aspects in other exemplary embodiments.

What is claimed is:

1. An image sensor comprising:
a first light sensing layer comprising first pixels configured to absorb and detect light of a first wavelength band and transmit light of a second wavelength band and light of a third wavelength band;
a second light sensing layer disposed to face the first light sensing layer, the second light sensing layer comprising second pixels configured to detect light of the second wavelength band and third pixels configured to detect light of the third wavelength band; and
color separation elements disposed between the first light sensing layer and the second light sensing layer, the color separation elements being configured to direct the light of the second wavelength band toward the second pixels, and direct the light of the third wavelength band toward the third pixels, and each of the color separation elements being symmetric in at least four directions parallel to a surface of the second light sensing layer.

2. The image sensor of claim 1, wherein the first pixels are arranged in a two-dimensional (2D) array structure, and
the second pixels and the third pixels are alternately arranged in a 2D array structure.

3. The image sensor of claim 1, wherein the first pixels, the second pixels and the third pixels are a same size, and
boundaries of the first pixels are aligned with boundaries of the second pixels and the third pixels.

4. The image sensor of claim 1, wherein each of the first pixels overlaps a portion of one of the second pixels and a portion of one of the third pixels.

5. The image sensor of claim 1, wherein the second light sensing layer comprises:
first pixel rows in which the second pixels and the third pixels are alternately arranged in an order of a second pixel and a third pixel in a first direction; and
second pixel rows in which the third pixels and the second pixels are alternately arranged in an order of a third pixel and a second pixel in the first direction, and
the first pixel rows and the second pixel rows are alternately arranged in a second direction perpendicular to the first direction.

6. The image sensor of claim 1, wherein the color separation elements are disposed to face the respective second pixels, and
the color separation elements are configured to direct the light of the second wavelength band in a straight downward direction, and direct the light of the third wavelength band toward sides of the color separation elements.

7. The image sensor of claim 1, wherein each of the color separation elements is symmetric in a horizontal direction of the second light sensing layer, a vertical direction of the second light sensing layer, a first diagonal direction, and a second diagonal direction that intersects the first diagonal direction.

8. The image sensor of claim 1, wherein each of the color separation elements comprises a first arm that extends in a first diagonal direction and a second arm that extends in a second diagonal direction that intersects the first diagonal direction.

9. The image sensor of claim 1, wherein the color separation elements are disposed to face the respective third pixels, and
the color separation elements are configured to direct the light of the third wavelength band in a straight downward direction, and direct the light of the second wavelength band toward sides of the color separation elements.

10. The image sensor of claim 1, wherein each of the color separation elements is shaped as at least one of a square tube, a cylinder, a cylindrical tube, a hexagonal pillar, and a hexagonal tube.

11. The image sensor of claim 1, wherein the color separation elements are disposed to face respective interfaces between the second pixels and the third pixels, and
the color separation elements are configured to direct the light of the second wavelength band toward first sides of the color separation elements, and direct the light of the third wavelength band toward second sides of the color separation elements, the second sides being opposite to the first sides.

12. The image sensor of claim 1, further comprising a color filter layer comprising a first color filter that is disposed on the second pixels and is configured to transmit the light of the second wavelength band to the second pixels, and a second color filter that is disposed on the third pixels and is configured to transmit the light of the third wavelength band to the third pixels.

13. The image sensor of claim 1, further comprising a transparent dielectric layer disposed between the first and second light sensing layers, the transparent dielectric layer covering the color separation elements.

14. The image sensor of claim 13, wherein the color separation elements comprise a material having a refractive index greater than that of the transparent dielectric layer.

15. An image pickup apparatus comprising an image sensor, the image sensor comprising:
a first light sensing layer comprising first pixels configured to absorb and detect light of a first wavelength band and transmit light of a second wavelength band and light of a third wavelength band;
a second light sensing layer disposed to face the first light sensing layer, the second light sensing layer comprising second pixels configured to detect light of the second wavelength band and third pixels configured to detect light of the third wavelength band; and
color separation elements disposed between the first light sensing layer and the second light sensing layer, the color separation elements being configured to direct the light of the second wavelength band toward the second pixels, and direct the light of the third wavelength band toward the third pixels.

16. The image pickup apparatus of claim 15, wherein each of the color separation elements is symmetric in at least four directions parallel to a surface of the second light sensing layer.

* * * * *